United States Patent [19]

Salvati

[11] Patent Number: 4,969,034
[45] Date of Patent: Nov. 6, 1990

[54] METHOD OF SIGNAL ENHANCEMENT

[75] Inventor: Jon Salvati, Skaneateles, N.Y.

[73] Assignee: Welch Allyn, Inc., Skaneateles Falls, N.Y.

[21] Appl. No.: 292,384

[22] Filed: Dec. 30, 1988

[51] Int. Cl.[5] .......................... H04N 7/18; H03M 1/18
[52] U.S. Cl. ...................................... 358/98; 358/166; 341/139
[58] Field of Search ................... 341/139; 358/98, 166, 358/168, 169, 174

[56] References Cited

U.S. PATENT DOCUMENTS

| Re. 31,289 | 7/1983 | Moore et al. | 358/98 X |
| Re. 31,290 | 7/1983 | Moore et al. | 358/98 X |
| 4,240,070 | 12/1980 | Helbig et al. | 341/139 |
| 4,412,207 | 10/1983 | Sinclair | 341/139 |
| 4,532,918 | 8/1985 | Wheeler | 358/98 X |
| 4,535,758 | 8/1985 | Longacre, Jr. | 358/98 X |
| 4,827,191 | 5/1989 | Chapman | 341/139 X |
| 4,831,378 | 5/1989 | Baars et al. | 358/174 X |
| 4,851,842 | 7/1989 | Iwamatsu | 341/139 |
| 4,853,774 | 8/1989 | Danna et al. | 358/98 |

Primary Examiner—James J. Groody
Assistant Examiner—Mark R. Powell
Attorney, Agent, or Firm—Wall and Roehrig

[57] ABSTRACT

A video system suitable for use in an endoscope/borescope and includes keyboard actuated circuits for dynamically controlling analog to digital converters to minimize noise interference and maximize information obtainable from the image displayed on a TV type display system.

2 Claims, 2 Drawing Sheets

METHOD OF SIGNAL ENHANCEMENT

BACKGROUND OF THE INVENTION

The present invention pertains to the field of art involving enhancement of the analog signal information received from a sensor prior to converting the analog signal to digital form.

A typical application of this invention is in an endoscope/borescope that is equipped with a video readout for providing television pictures of a remote target. As explained in greater detail in U.S. Pat. Nos. Reissue 31289 and Reissue 31290 to Moore et al., it is now possible with solid state image sensors sometimes referred to as charge coupled devices (CCD) to provide the insertion head of an endoscope/borescope with an extremely small video camera permitting access to extremely confined regions that have heretofore been inaccessible. Full color video pictures of the target can be created using a single imager by illuminating the targets sequentially with light of primary colors to produce color separated images. After each color separated image is recorded, image data is clocked out in the form of video signals and delivered to a video processor where the combined data is placed in a form that is suitable for display on a television screen.

As is well known in the art, the viewing head of an endoscope/borescope is mounted at the distal end of the insertion tube and is generally required to operate within a very confined area with little if any ambient light. Light is generally brought into the image region by means of a fiber optic bundle. As the head moves towards or away from a given target situated in this confined region the amount of light reflected from the target to the image sensor will vary substantially. Although automatic light control and automatic gain control circuits have been included in the video section of these instruments, this in itself may not be sufficient to allow retrieval of all the information contained in the image signal i.e. the sensor may become saturated with light (blooming) or remain dark or otherwise provide an image that is difficult to read in complete detail. A further problem is sometimes encountered with weak video signals whereby background noise becomes visible and obscures the desired image.

OBJECTS AND SUMMARY OF THE INVENTION

It is therefore an object of this invention to provide a method for enhancing the signal received from a sensor.

It is another object of the present invention to provide an apparatus for modifying the video signal from a video sensor to enhance the sharpness, contrast and apparent dynamic range capabilities of the system.

It is yet another object of the present invention to improve a video equipped endoscope/borescope by providing a dynamically controlled system for improving sharpness, contrast and apparent dynamic range of the video image received from a CCD sensor to extract the maximum possible information from the image obtained.

It is a further object of the present invention to provide an apparatus for enhancing the video image from a video sensor by manipulating the effective gain and span of the video signal amplification system.

It is still a further object of the present invention to provide an operator controlled apparatus for selectively modifying the sharpness and contrast of an image received from a CCD sensor in an endoscope/borescope.

It is still a further object of the present invention to provide in a video equipped endoscope/borescope a method of adjusting at least one of the reference points of an analog to digital converter device to enhance the apparent dynamic range of the video signal.

These and other objects of the present invention are attained by means of a video system suitable for use in an endoscope/borescope and includes keyboard actuated circuits for dynamically controlling analog to digital converters to minimize noise interference and maximize information obtainable from the image displayed on a TV type display system.

DETAILED DESCRIPTION OF THE PREFERRED EMBODIMENT

Figure 1:
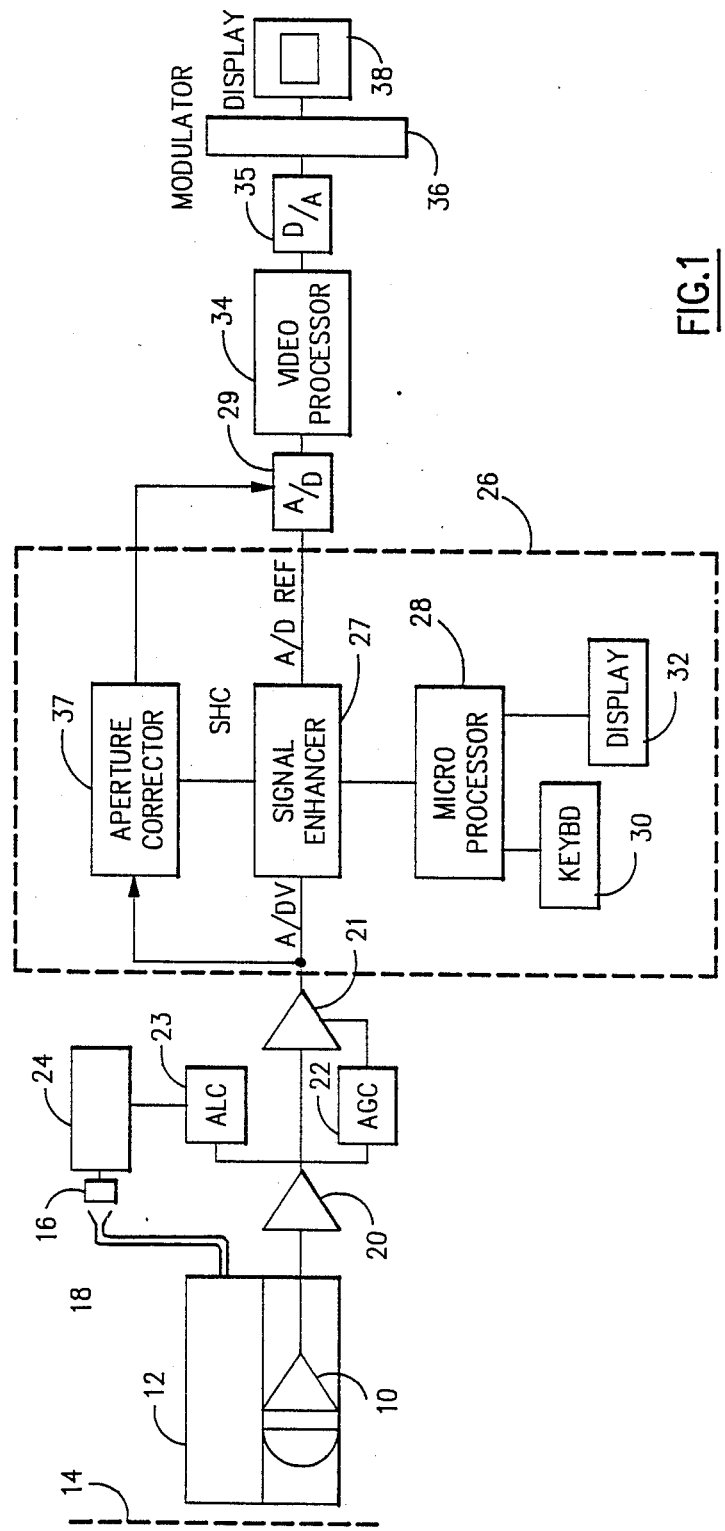
FIG. 1 is a block diagram of an endoscope/borescope system incorporating an embodiment of the invention.

Referring now to FIG. 1 there is shown an image signal enhancing system for use in a video equipped endoscope/borescope that is capable of providing a video picture of a remote target. As described in greater detail in the previously referenced Moore et al. patents, a solid state image sensor 10 is positioned in the distal end of an insertion tube 12 so that the recording surface of the sensor is able to view a target 14. Typically the target is located in a remote region and as a consequence there is little or no ambient light available for target illumination. As explained by Moore et al. light is brought into the target region from an outside source such as a lamp 16 through a fiber optic bundle 18. Typically light 16 is a flash or strobe light arranged to transmit light through the fiber optic bundle 18 and illuminate the target. The video signal from target 14 is picked up by the image sensor 10 and fed to a video amplifier 20 which in turn feeds a second video amplifier 21, an automatic gain control 22, and an automatic light control 23. These latter devices typically may incorporate one or more of the inventions shown in U.S. Pat. No. 4,532,918 to Wheeler or U.S. Pat. No. 4,535,758 to Longacre for optimizing the video signal received from the video sensor. The automatic light control portion feeds back through the light control circuitry 24 to optimize the light output while the automatic gain control feeds back to vary the gain of video amplifier 21. Thus the video signal is optimized by conventional methods before any enhancement effort is made.

The signal enhancing apparatus 26 is shown in block diagram form as consisting of a video signal enhancer segment 27, microprocessor 28 and a keyboard 30, and signal enhancer status display unit 32. The video signal from amplifier 21 is fed to the signal enhancer 27 and also to an analog to digital converter (A-D converter) 29 controlled by the enhancer 27 through aperture corrector 37. The enhanced digital signal output of converter 29 then passes through the video processor 34, a digital to analog converter 35 (D-A converter), a modulator 36 and TV display 38, all as described in more detail in Moore et al. previously cited.

The signal enhancer display unit 32 indicates the condition of the various functions offered by the enhancer as follows:

(1) a status function that shows whether the video signal is in the "normal" mode or the "enhanced" mode, (2) a sharpness function that indicates whether the operator through the keyboard 30 and microprocessor 28 has adjusted the aperture corrector to one of 10 settings from 0-9, (3) a contrast function that indicates whether the operator has selected any of settings 0-9 inclusive through the keyboard 30 and microprocessor 28 to enhance the contrast and/or establish a "target contrast" for automatic enhancement, and (4) a limit function which indicates selection of automatic or manual mode by a "yes" for auto and a "no" for manual.

Briefly the indicated functions allow the operator to set the endoscope/borescope for optimum image definition and readability depending upon the particular environment encountered at the image. The signal enhancer via the keyboard may be operated in a manual mode for each particular picture to be studied or it may be set for automatic mode which will be indicated in display 32 as "yes".

The technique of converting an analog signal to digital form for further processing is well known. Basically an analog signal is broken into a predetermined number of discreet digital voltage steps. Typically a 5 volt analog signal may be broken into 256 steps by an 8 bit converter so that each step represents a small fraction of a volt. Step sizes are chosen to eliminate unwanted noise without losing wanted signals and generally are spread between two fixed reference points i.e. +5V and +10V.

This invention teaches the fixing of the lower limit at 0 and the dynamic manipulation of the upper limit of an A–D converter from the chosen maximum i.e. 5 volts, down to a lower voltage chosen to yield maximum resolution and clarity for the particular image conditions presented. Theoretically this lower voltage could be set at a fraction of a volt but as a practical matter there is a lower limit at which you encounter the basic noise on the video signal and the representation is lost in the background noise. Dramatic improvements in apparent resolution can be obtained by adjusting the upper set point to dynamically follow the maximum video signal when it is above or below a programed reference.

Thus when the video signal is 1 volt instead of 5 volts and the upper limit of the A–D converter is set at 1 volt a file fold improvement in apparent resolution is obtained since each digital step is 5 times smaller and thus smaller increments of information can be seen in the video image. (At a 5 volt upper limit an approximate 0.02 volt signal can be seen, while at a 1 volt upper limit an approximate 0.004 volt signal can be seen.) This results in a dramatic improvement in contrast in a video image and even in discovery of information that could not have been seen with the higher reference voltage limit, due to the A–D quantization noise being greater than the lower levels of the incoming video information.

Using this technique, images that normally would be buried in the A–D quantization noise may be seen and their clarity will be degraded only by the background noise inherent in the original analog video signal.

Conversely, as the video signal strength increases, the upper limit of the A–D converter 29 is raised to track the peak analog signal strength when in the "yes" or automatic mode. While the actual digital step size increases, (the same 256 steps are spread over a greater voltage), since the signal to noise ratio remains constant and the desired signal is say 2 volts instead of 1 volt, the apparent dynamic range when seen on the video screen seems to have increased by an order of magnitude. The present invention therefore achieves an apparent increase in dynamic range at both the low and high ends of signal strength.

Figure 2:
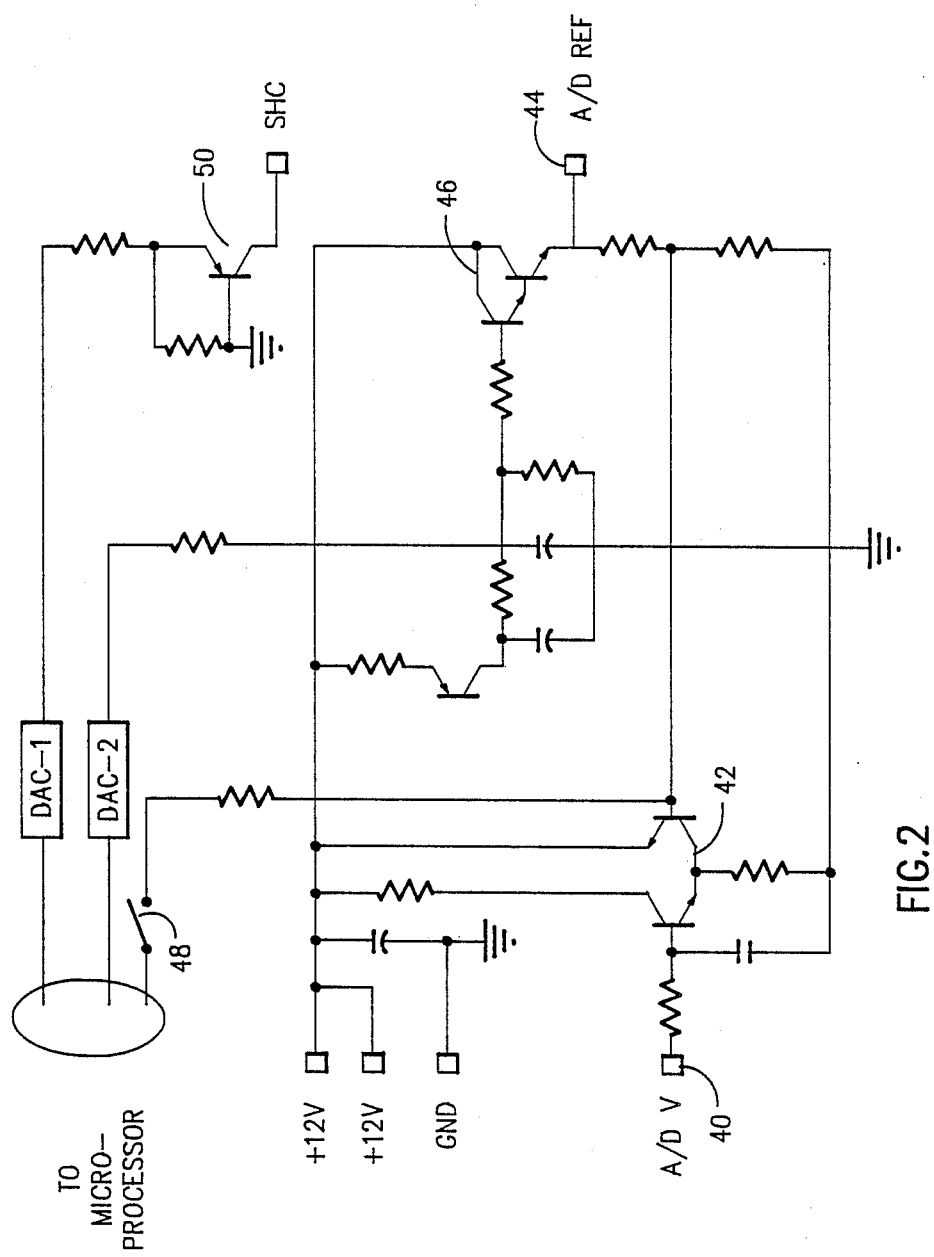
FIG. 2 is a schematic diagram of a signal enhancer in accordance with the present invention.

FIG. 2 is a partial schematic of the signal enhancer for accomplishing this manipulation both in the manual and automatic mode. The optimized video signal output from amplifier 21 is fed at 40 into a differential amplifier 42 where it is compared with an analog to digital reference voltage 44. The video signal voltage at 40 and reference voltage 44 are also fed to A–D converter 29. A–D reference voltage 44 is derived from a signal from microprocessor 28 through D–A converter (DAC-2) and Darlington pair 46. Reference voltage 44 may have an absolute value different than the voltage at 40 as is well known in the art as long as the relative relationship is maintained.

Any difference between signals 40 and 44 detected at 42 is used to derive a correcting voltage in conjunction with DAC-2 to adjust voltage 44 to maintain its relationship to voltage 40. Thus the upper reference point on A–D converter 29 is made to relatively track the incoming video signal received by A–D converter 29 from amplifier 21. The beginning A–D reference voltage 44 is set by the operator through the keyboard 30 and micro processor 28 by selecting the desired increment from 0–9 of the contrast control which selection is indicated on display 32.

This circuit is set for automatic tracking of the video signal as it exceeds the predetermined reference unless disabled by the closing of the switch 48 which then shorts out the differential amplifier 42. This is accomplished at the keyboard by setting the "limit" function to either "yes" or "no". In the "yes" position, automatic operation is permitted as described above and in the "no" position the manually pre-set voltage 44 from DAC-2 is routed to set the upper voltage limit for the A–D converter 29. In the."no" or manual position, the analog to digital reference voltage 44 is programed in from the keyboard by the operator setting the desired setting from 0 to 9 corresponding to increasing voltage levels in the 0 to 5 volt preselected range for operation of this A–D converter function.

Also shown in FIG. 2 is the sharpness control which operates through a digital to analog converter DAC-1 fed from the microprocessor 28. The operator by moving the sharpness control from 0-9 can set the desired voltage input to DAC-1. Functioning as a digital to analog converter DAC-1 outputs a corresponding analog voltage. The analog voltage output from DAC-1 is then converted through the transistor 50 to a current, proportional to the desired voltage, which is fed back to control the aperture corrector 37 in the amplifier chain. Aperture corrector 37 as is well known in the art monitors the video signal and adds a correction factor to the video signal to sharpen the edges of the video image.

Thus in operation this device permits the operator to manipulate the A–D converter 29 to optimize the dynamic range of the digital conversion of the video image to obtain the most information possible from the video signal. By this manipulation it is possible to enhance certain details of a particular image and even "dig out" information buried in the noise. The A–D conversion appears to have greater resolution than a fixed A–D converter. The operator can determine features that may be of critical importance and adjust the contrast, sharpness and method of contrast limiting. By the same token the enhancement may be programed to degrade other areas that are not of interest at the moment in order to provide further enhancement of certain picture areas which may be of significantly lower voltage levels than the rest of the video signal. Thus with operator preferences entered into the microprocessor the best of both worlds can be obtained.

By first allowing the automatic gain control features that may be present in the endoscope/borescope to present the best available image the operator can then adjust the sharpness and contrast controls to maximize the information available from the particular part of the image being investigated. The operator through the keyboard selects settings from 0 to 9 for sharpness and contrast for maximum information yield on the particular image presented. Once this optimum or near optimum level is determined the operator can turn the limit control to "yes" and it will automatically maintain that setting even if the video signal varies. As the video signal increases the system in "automatic" will track it up maintaining optimum contrast for the stronger signal. As the video signal decreases the reference voltage 44 will be decreased down to the initial preset value or to the "unenhanced" level as the case may be. Obviously the greater the span that can be obtained by the manipulation of the upper limit of the analog to digital converter reference voltage, the greater the contrast and the dynamic range of the digitized video image.

While this invention is particularly useful in enhancing the image of dimly lit targets to maximize the information obtainable there are other situations where this invention can digitize information in an adaptive manner to increase the apparent dynamic range of the digital conversion.

When a portion of a target is brightly illuminated and a portion is not the usual automatic gain control will optimize the strong signal portion causing the dimly lit portion to appear black. With the present invention in the "manual" mode the upper limit 44 of A-D converter 29 can be lowered step by step using the 0-9 step contrast control through the keyboard 32 until the dark portion becomes visible. The signal from the bright portion will be "clipped" at the lowered limit level and the displayed image in that portion will experience "white" flattening or saturation. The dimly lit image portion, however, will become visible and the desired information realized. The "white" portion of the image that has "saturated" is ignored or it can be viewed alternatively by switching the device to the "yes" or automatic mode and the circuits described above will raise the upper set point of the A-D converter 29 until the strong signal portion is visible.

While this invention has been explained with reference to an apparatus for enhancing the video image of an endoscope/borescope this concept could be used to enhance any signal that can be improved by analog to digital manipulation and could be used in a variety of applications to enhance signal dynamic range and apparent resolution. This application is intended to cover any modifications or changes as may come within the scope of the following claims.

What is claimed is:

1. In a video endoscope/borescope having a solid state image sensor located in the viewing head for recording light images of a target and providing image data in the form of video signals, a video signal manipulating device that includes
    detector means for sensing the level of the video signal from the image sensor,
    analog to digital converter means for converting said image sensor video signals from analog to digital form,
    said A-D converter means having at least one variable voltage range setting,
    means for generating an analog to digital converter reference signal,
    comparator means for comparing said video signal level and said reference signal level and developing a control signal proportional to the difference thereof,
    processor means for causing said control signal to vary one of said A-D converter voltage settings in proportion to said difference, whereby the effective resolution of the analog to digital conversion process is enhanced,
    control means for changing the amount of aperture correction applied to the video signal, and
    control means to selectively activate said signal manipulating device and indicator means to show said activated condition.

2. In a video endoscope/borescope having a solid state image sensor located in the viewing head for recording light images of a target and providing image data in the form of video signals, a video signal manipulating device that includes
    detector means for sensing the level of the video signals from the image sensor,
    analog to digital converter means for converting said image sensor video signals from analog to digital form,
    said A-D converter means having at least one variable voltage range setting,
    means for generating an analog to digital converter reference signal,
    comparator means for comparing said video signal level and said reference signal level and developing a control signal proportional to the difference thereof,
    processor means for causing said control signal to vary one of said A-D converter voltage settings in proportion to said difference, whereby the effective resolution of the analog to digital conversion process is enhanced,
    said comparator means including switch means for selectively bypassing the comparator means for said video signals and feeding the reference signal only to said A/D converter means.

* * * * *